US006950152B2

United States Patent
Yamamoto

(10) Patent No.: US 6,950,152 B2
(45) Date of Patent: Sep. 27, 2005

(54) TELEVISION TUNER WHICH HAS LEVELED A GAIN DEVIATION IN THE SAME BAND

(75) Inventor: Masaki Yamamoto, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 539 days.

(21) Appl. No.: 10/271,922

(22) Filed: Oct. 16, 2002

(65) Prior Publication Data

US 2003/0076449 A1 Apr. 24, 2003

(30) Foreign Application Priority Data

Oct. 18, 2001 (JP) ........................................ 2001-320346
Oct. 19, 2001 (JP) ........................................ 2001-322019

(51) Int. Cl.$^7$ ................................................. H04N 5/50
(52) U.S. Cl. ........................ 348/731; 348/725; 348/729; 455/180.4; 455/191.2
(58) Field of Search .............................. 334/11, 18, 87, 334/42, 52; 348/731, 732, 733, 725, 729, 730; 455/178.1, 180.2, 180.4, 187.1, 188.2, 189.1, 191.1, 191.2, 191.3

(56) References Cited

U.S. PATENT DOCUMENTS

| | | | | | |
|---|---|---|---|---|---|
| 3,686,575 | A | * | 8/1972 | Chamberlain | ............ 455/180.4 |
| 4,499,495 | A | * | 2/1985 | Strammello | ................. 348/731 |
| 4,771,332 | A | * | 9/1988 | Metoki | ........................ 348/731 |
| 6,108,050 | A | * | 8/2000 | Yamamoto et al. | ......... 348/731 |
| 6,226,503 | B1 | * | 5/2001 | Yamamoto et al. | ...... 455/180.4 |
| 6,342,928 | B1 | * | 1/2002 | Ohira | ......................... 348/729 |
| 6,351,294 | B1 | * | 2/2002 | Yamamoto et al. | ......... 348/731 |
| 6,639,630 | B2 | * | 10/2003 | Osada et al. | ................ 348/731 |
| 6,665,022 | B1 | * | 12/2003 | Yamamoto et al. | ......... 348/731 |
| 6,791,626 | B2 | * | 9/2004 | Yamamoto et al. | ......... 348/729 |
| 6,842,198 | B2 | * | 1/2005 | Suzuki et al. | ............... 348/731 |

FOREIGN PATENT DOCUMENTS

JP 2000-115008 4/2000

* cited by examiner

Primary Examiner—John Miller
Assistant Examiner—Jean W. Désir
(74) Attorney, Agent, or Firm—Brinks Hofer Gilson & Lione

(57) ABSTRACT

A gain deviation is leveled in the same band by using a varactor diode having the same characteristics as that used in an input tuning circuit for coupling the input tuning circuit and a high frequency amplifier The input tuning circuit has a tuning varactor diode whose tuning frequency varies with a tuning voltage applied to the cathode of the tuning varactor diode, a high-frequency amplifier is provided in a stage subsequent to the input tuning circuit, and a coupling varactor diode for coupling the input tuning circuit to the high-frequency amplifier, in which the cathode of the coupling varactor diode and that of the tuning varactor diode are connected with each other and a bias voltage higher than the voltage at the anode of the tuning varactor diode and lower than the lowest voltage of the tuning voltage is applied to the anode of the coupling varactor diode.

5 Claims, 8 Drawing Sheets

TELEVISION TUNER WHICH HAS LEVELED A GAIN DEVIATION IN THE SAME BAND

BACKGROUND OF THE INVENTION

1. Field of the Invention

The present invention relates to a television tuner and in particular to a television tuner equipped with a coupling varactor diode.

2. Description of the Related Art

FIG. 8 shows a circuit diagram of a related art television tuner. A television signal in the VHF band to UHF band is input to a VHF input tuning circuit 22 and a UHF input tuning circuit 23 via a trap circuit 21 for removing unnecessary signals such as an FM broadcast signal.

The VHF input tuning circuit 22 has a tuning varactor diode 22a whose anode is grounded, four coils sequentially connected serially with the cathode thereof via high frequencies and connected in parallel with the tuning varactor diode 22a via high frequencies, that is, a high-band coil 22b, a low-band coil 22c, a low-band coil 22d and a high-band coil 22e, and a switch diode 22f connected in parallel across two low-band coils 22c and 22d via high frequencies. Inductance of the high-band coils 22b, 22e is smaller than that of the low-band coils 22c and 22d. The high-band coil 22e on the low potential side is grounded via high frequencies by a DC cut capacitor 22g. To the connection point of the two low-band coils 22c and 22d is input a television signal. The connection point of the cathode of the tuning varactor diode 22a and the high-band coil 22b serves as an output end of the VHF input tuning circuit 22.

The connection point of the high-band coil 22e and the DC cut capacitor 22g is grounded by a resistor 22h and connected to a power terminal B by a resistor 22i. A power voltage of 5 volts is applied to the power terminal B. A bias voltage divided by the resistors 22h and 22i is applied to the anode of the switch diode 22f via the high-band coil 22e and the low-band coils 22d, 22c. The cathode of the switch diode 22f is connected to a band switching terminal Sw. A high-level (5-volt) or low-level (0-volt) switching voltage is applied to the band switching terminal. The cathode of the tuning varactor diode 22a is connected to a tuning voltage terminal Tu via the high-band coil 22b. A tuning voltage is applied to the tuning voltage terminal Tu.

In a stage subsequent to the VHF input tuning circuit 22 is provided a VHF high-frequency amplifier 24 comprising an FET (Field Effect Transistor). The VHF input tuning circuit 22 and the VHF high-frequency amplifier 24 are coupled to each other via a coupling varactor diode 25. The coupling varactor diode 25 has the same characteristics as those of the tuning varactor diode 22a. The cathode of the coupling varactor diode 25 is connected to the cathode of the tuning varactor diode 22a. The anode of the coupling varactor diode 25 is grounded by a resistor 26 and coupled to the input end of the VHF high-frequency amplifier 24 via a DC cut capacitor 27.

A capacitor 28 is connected between the connection point of the two low-band coils 22c, 22d and the anode of the coupling varactor diode 25. A capacitor 29 is connected between the connection point of the high-band coil 22b and the low-band coil 22c and the anode of the coupling varactor diode 25.

In a stage subsequent to the VHF high-frequency amplifier 24 is provided a VHF inter-stage tuning circuit 40, subsequently to which is provided a VHF mixer (not shown). The VHF inter-stage tuning circuit 40 and the subsequent configuration will not be described.

A UHF input tuning circuit 23 has a coil 23a one end of which is grounded, and two tuning varactor diodes 23b, 23c of the same characteristics whose cathodes are connected to each other. The anode of one tuning varactor diode 23b is connected to the other end of the coil 23a. The anode of the other tuning varactor diode 23c is grounded by a DC cut capacitor 23d and a resistor 23e. The connection point of the coil 23a and the anode of the tuning varactor diode 23b is connected to a trap circuit 21 via a DC cut capacitor 41. The cathodes of the two tuning varactor diodes 23b, 23c are connected to the tuning voltage terminal Tu and to a UHF high-frequency amplifier 43 by a DC cut capacitor 42. An FET is used also in the UHF high-frequency amplifier 43.

In a stage subsequent to the UHF high-frequency amplifier 43 is provided a UHF inter-stage tuning circuit 44, subsequently to which is provided a UHF mixer (not shown). The UHF inter-stage tuning circuit 44 and the subsequent configuration will not be described.

In the aforementioned configuration, in order to receive a television signal in the VHF band, the VHF high-frequency amplifier 24 is placed in the active state while the UHF high-frequency amplifier 43 is placed in the inactive state. In order to receive a television signal in the UHF band, the UHF high-frequency amplifier 43 is placed in the active state while the VHF high-frequency amplifier 24 is placed in the inactive state.

In the case of receiving a high-band television signal in the VHF band, a voltage at the band switching terminal Sw is driven low. This turns on the switch diode 22f and the VHF input tuning circuit 22 serves as an equivalent circuit shown in FIG. 9. A coil 22j in FIG. 9 shows two low-band coils 22c, 22d in FIG. 8 connected in parallel.

A tuning frequency is mainly determined by two high-band coils 22b, 22e and a tuning varactor diode 22a. A tuning voltage within the range of about 2.5 to 25 volts is applied to the cathode of the tuning varactor diode 22a, and accordingly a tuning frequency varies in the high band. The capacitance value of the tuning varactor diode 22a obtained when the tuning voltage is 2.5 volts is about 14.5 pF (picofarad) which is tuned to the lowest frequency of the high band. The capacitance value is 2 to 3 pF when the tuning voltage reaches 25 volts.

As understood from FIG. 9, a series/parallel-resonance circuit comprises a capacitor 28, a coil 22j, a high-band coil 22b, and a coupling varactor diode 25. The series/parallel-resonance circuit serves as a trap circuit for attenuating image frequencies that accompany incoming high-band signals.

Similarly, another series/parallel-resonance circuit comprises a capacitor 29, a high-band coil 22b, and a coupling varactor diode 25. The series/parallel-resonance circuit serves as a trap circuit for attenuating the higher frequencies in the UHF band.

Both circuits are used for countermeasure against broadcasting interference.

In the case of receiving a low-band television signal in the VHF band, a voltage at the band switching terminal Sw is driven high. This turns off the switch diode 22f and the VHF input tuning circuit 22 serves as an equivalent circuit shown in FIG. 10. A tuning frequency is mainly determined by two high-band coils 22b, 22e, two low-band coils 22c, 22d, and a tuning varactor diode.

In this case also, in the VHF input tuning circuit 22, a tuning frequency varies in the low band in accordance with a tuning voltage within the range of about 2.5 to 25 volts applied to the cathode of the tuning varactor diode 22a. The tuning frequency is tuned to the lowest frequency of the low band when the tuning voltage is 2.5 volts.

Further, a series/parallel-resonance circuit comprising a capacitor 28, a low-band coil 22c, a high-band coil 22b, and a coupling varactor diode 25 serves as a trap circuit for attenuating image frequencies that take place when low-band signals are received by using parallel resonance frequencies.

FIG. 11 shows a circuit diagram of another related art television tuner. An input tuning circuit 31 to which a television signal in the VHF band is input comprises a single tuning circuit, in which a switch diode 31a and a varactor diode 31b are provided. The switch diode 31a is switched on/off and accordingly the input tuning circuit 31 is switched so as to be tuned to the high band or low band of the VHF band. A tuning voltage is applied to a tuning varactor diode 31b by the tuning voltage terminal Tu. The anode of the tuning varactor diode 31b is grounded. By varying the tuning voltage applied to the cathode, the tuning frequency varies in each band.

In a stage subsequent to the input tuning circuit 31 is provided a high-frequency amplifier 32. An FET (not shown) is used as its amplifying element.

In a stage subsequent to the high-frequency amplifier 32 is provided a double tuning circuit 33. A simple configuration of the double tuning circuit 33 is shown. On the preliminary side of the double tuning circuit 33 are provided a high-band coil 33a and a low-band coil 33b serially connected to each other, a tuning varactor diode 33c connected in parallel with these coils, and a switch diode 33d connected in parallel with the low-band coil 33b.

Similarly, on the secondary side are provided a high-band coil 33e and a low-band coil 33f serially connected to each other, a tuning varactor diode 33g connected in parallel with these coils, and a switch diode 33h connected in parallel with the low-band coil 33f. The anodes of the two tuning varactor diodes 33c, 33g are grounded. A tuning voltage is applied on the cathode thereof by the tuning voltage terminal Tu. Two switch diodes 33d, 33h are switched on/off and accordingly the double tuning circuit 33 is switched so as to be tuned to the high band or low band. By varying the tuning voltage applied to the cathodes of the tuning varactor diodes 33c, 33g, the tuning frequency in each band is varied.

In a stage subsequent to the double tuning circuit 33 is provided a mixer for frequency conversion 34. The mixer 34 is coupled to the double tuning circuit 33 via a coupling varactor diode 35. The cathode of the coupling varactor diode 35 is connected to the cathode of the tuning varactor diode 33g on the secondary side. The anode of the coupling varactor diode 35 is connected to the ground as well as to the mixer 34 via a DC cut capacitor 37. A local oscillating signal is provided to the mixer 34 from a local oscillator 38.

In the aforementioned configuration, the tuning varactor diode 31b in the input tuning circuit 31, two tuning varactor diodes 33c, 33g in the double tuning circuit 33, and the coupling varactor diode 35 have the same characteristics. The voltage/capacitance characteristics are such that the inclination of a variation in the capacitance value is steep in a range where the tuning voltage is lower while the inclination of a variation in the capacitance value is gentle in a range where the tuning voltage is higher, as shown in FIG. 12.

The variable range of the tuning voltage applied to the cathode of each of the tuning varactor diodes 31b, 33c, 33g and the coupling varactor diode 35 is determined by the range of a tuning frequency required for each tuning circuit 31, 33, and is about 2.5 volts to 25 volts for the high band and about 2.5 volts to 21 volts for the low band. That is, a tuning voltage of 2.5 volts is tuned to the lowest frequency in each band. The capacitance value of each of the tuning varactor diodes 31b, 33c, 33g and the coupling varactor diode 35 is about 14.5 pF (picofarad) as shown in FIG. 12.

A television signal roughly selected by the input tuning circuit 31 is amplified by the high-frequency amplifier 32. The resulting television signal is further steeply selected by the double tuning circuit 33 then input to the mixer 34. The television signal is mixed with a local oscillating signal in the mixer 34 and an intermediate frequency signal is output.

In the configuration shown in FIG. 8, the inductance of the high-band coil 22b is negligible in receiving a low-band signal in the VHF band so that the capacitor 29 is connected in parallel with the coupling varactor diode 25. Thus, the coupling volume of the VHF input tuning circuit 22 and the VHF high-frequency amplifier 24 increases and in particular a gain in a high frequency channel in the low band becomes higher thus increasing the gain deviation.

The capacitor 29 is connected in parallel with the coupling varactor diode 25. This causes a problem that tracking of the parallel resonance frequency of a series/parallel-resonance circuit comprising a capacitor 28, a low-band coil 22c, a high-band coil 22b, and a coupling varactor diode 25 and the tuning frequency of the VHF tuning circuit 22 is misaligned.

The invention thus aims at reducing a gain deviation in receiving low-band signals as well as aligning the tracking of the resonance frequency of a trap circuit for attenuating image frequencies and the tuning frequency of a VHF input tuning circuit.

Generally speaking, the gain of a television tuner decreases as the frequency in the receiving channel decreases, starting from the state where Q of each tuning circuit and impedance between stages are matched. In the low band, for example, the gain is about 38 dB at the frequency in the lowest-frequency channel where the tuning voltage is 2.5 volts and about 42 dB in case the tuning voltage is 21 volts, the resulting gain deviation in the same band being as large as 4 dB, as shown in FIG. 13.

The NF (noise figure) is 6.3 dB in the lowest-frequency channel and 4.4 dB in case the tuning voltage is 21 volts, showing a worse NF characteristic in the lower side.

In order to correct such a gain deviation in the same band and poor NF, a varactor diode with larger capacitance value at the minimum tuning voltage (2.5 volts) and a larger ratio to the capacitance value obtained when the tuning voltage has dropped may be used to provide tight coupling of the double tuning circuit 33 and the mixer 34 in lower frequencies. Such a varactor, however, is costly.

The invention thus aims at leveling a gain deviation in the same band by using a varactor diode having the same characteristics as those of the varactor used in a double tuning circuit for coupling a double tuning circuit to a mixer, without using a costly and special varactor diode.

SUMMARY OF THE INVENTION

In order to solve the problems, the invention provides a television tuner comprising an input tuning circuit having a tuning varactor diode whose tuning frequency varies with a tuning voltage applied to the cathode of the tuning varactor diode, a high-frequency amplifier provided in a stage subsequent to the input tuning circuit, and a coupling varactor diode for coupling the input tuning circuit to the high-frequency amplifier, characterized in that the cathode of the coupling varactor diode and that of the tuning varactor diode are connected with each other and that a bias voltage higher than the voltage at the anode of the tuning varactor diode and lower than the lowest voltage of the tuning voltage is applied to the anode of the coupling varactor diode.

The invention further provides a television tuner characterized in that the input tuning circuit has a switch diode switched on/off and comprises a band-switching tuning circuit tuned to the high-band or low band of the VHF band, that a fixed bias voltage is applied to the anode of the switch diode and a switching voltage to turn on/off the circuit is applied to the cathode thereof, and that the anode of the tuning varactor diode is grounded and the anode of the coupling varactor diode is connected to the anode of the switch diode via a DC.

The invention further provides a television tuner comprising a double tuning circuit having a tuning varactor diode whose tuning frequency varies with a tuning voltage applied to the cathode of the tuning varactor diode, a mixer provided in a stage subsequent to the double tuning circuit, and a coupling varactor diode for coupling the double tuning circuit to the mixer, characterized in that the cathode of the coupling varactor diode and that of the tuning varactor diode are connected with each other and that a bias voltage higher than the voltage at the anode of the tuning varactor diode and lower than the lowest voltage of the tuning voltage is applied to the anode of the coupling varactor diode.

The invention further provides a television tuner characterized in that the mixer has a transistor to whose base is applied a bias voltage and that the anode of the tuning varactor diode is grounded and the anode of the coupling varactor diode is directly connected to the base of the transistor.

The invention further provides a television tuner characterized in that the double tuning circuit comprises a band-switching tuning circuit tuned to the high-band or low band television signals in the VHF band.

DESCRIPTION OF THE PREFERRED EMBODIMENTS

Figure 1:
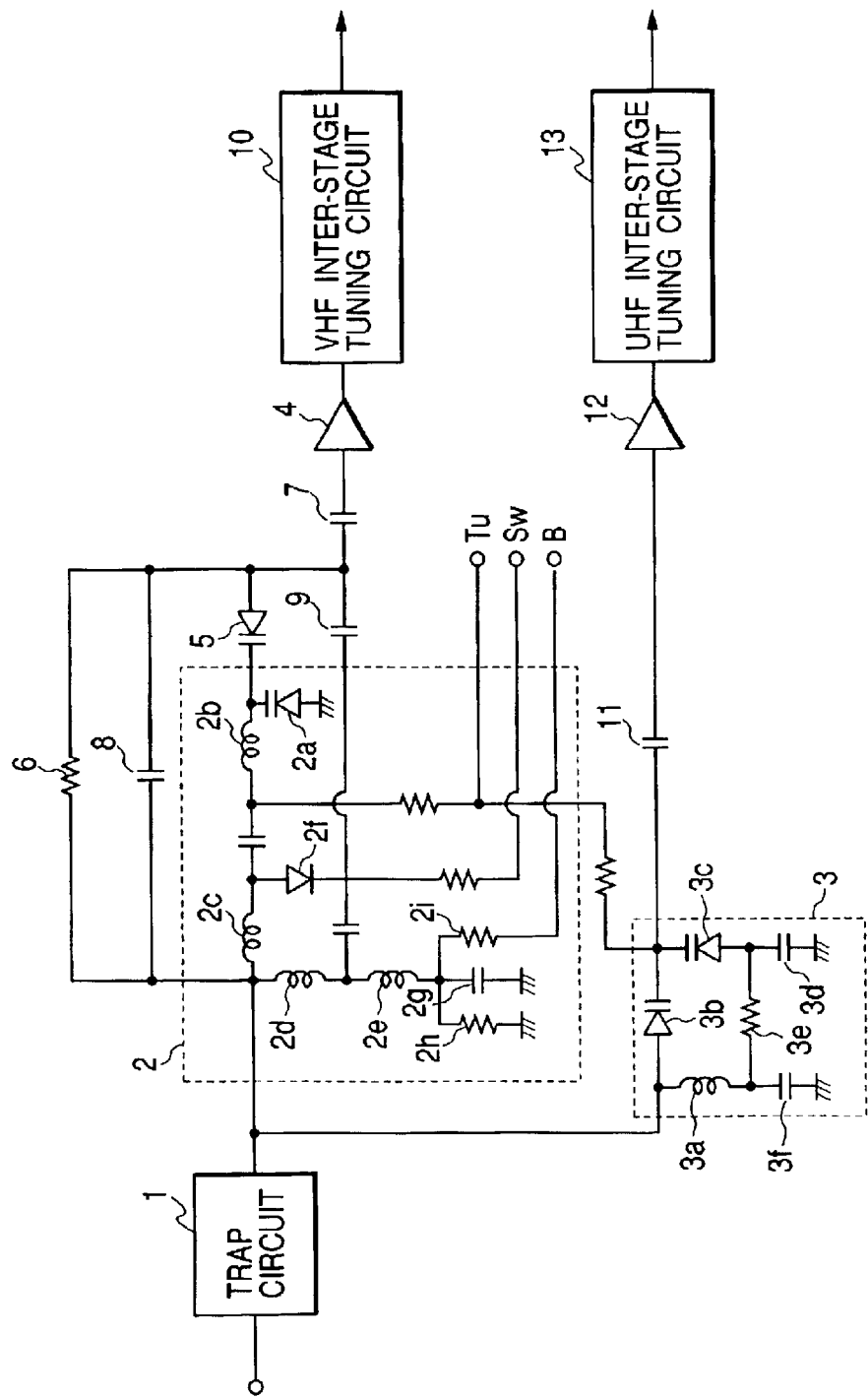
FIG. 1 is a circuit diagram showing the configuration of a television tuner according to the first embodiment of the invention.

The first embodiment of the invention will be described in accordance with the drawings. In FIG. 1, a television signal in the VHF band to the UHF band is input to a VHF input tuning circuit 2 and a UHF input tuning circuit 3 via a trap circuit 1 for removing unnecessary signals such as an FM broadcast signal.

The VHF input tuning circuit 2 has a tuning varactor diode 2a whose anode is grounded, a high-band coil 2b, a low-band coil 2c, a low-band coil 2d and a high-band coil 2e sequentially connected serially with the cathode of the tuning varactor diode 2a via high frequencies and connected in parallel with the tuning varactor diode 2a via high frequencies, and a switch diode 2f connected in parallel across two low-band coils 2c and 2d via high frequencies. Inductance of the high-band coils 2b, 2e is smaller than that of the low-band coils 2c and 2d. The high-band coil 2e on the low potential side is grounded via high frequencies by a DC cut capacitor 2g. To the connection point of the two low-band coils 2c and 2d is input a television signal. The connection point of the cathode of the tuning varactor diode 2a and the high-band coil 2b serves as an output end of the VHF input tuning circuit 2.

The connection point of the high-band coil 2e and the DC cut capacitor 2g is grounded by a resistor 2h and connected to a power terminal B by a resistor 2i. A power voltage of 5 volts is applied to the power terminal B. A bias voltage of little less than two volts divided by the resistors 2h and 2i is applied to the anode of the switch diode 2f via the high-band coil 2e and the low-band coils 2d, 2c. The cathode of the switch diode 2f is connected to a band switching terminal Sw. A high-level (5-volt) or low-level (0-volt) switching voltage is applied to the band switching terminal Sw. The cathode of the tuning varactor diode 2a is connected to a tuning voltage terminal Tu via the high-band coil 2b. A tuning voltage is applied to the tuning voltage terminal Tu.

In a stage subsequent to the VHF input tuning circuit 2 is provided a VHF high-frequency amplifier 4 comprising an FET (Field Effect Transistor). The VHF input tuning circuit 2 and the VHF high-frequency amplifier 4 are coupled to each other via a coupling varactor diode 5. The coupling varactor diode 5 has the same characteristics as those of the tuning varactor diode 2a. The cathode of the coupling varactor diode 5 is connected to the cathode of the tuning varactor diode 2a. The anode of the coupling varactor diode 5 is connected to the connection point of the two low-band coils 2c, 2d by a resistor 6 and coupled to the VHF high-frequency amplifier 4 via a DC cut capacitor 7. As a result, the aforementioned bias voltage is also applied to the anode of the coupling varactor diode 5.

A capacitor 8 is connected between the connection point of the two low-band coils 2c, 2d and the anode of the coupling varactor diode 5. A capacitor 9 is connected between the cathode of the switch diode 2f and the anode of the coupling varactor diode 5.

In a stage subsequent to the VHF high-frequency amplifier 4 is provided a VHF inter-stage tuning circuit 10, subsequently to which is provided a VHF mixer (not shown). The VHF inter-stage tuning circuit 10 and the subsequent configuration will not be described.

The UHF input tuning circuit 3 has a coil 3a one end of which is grounded by a DC cut capacitor 3f, and two tuning varactor diodes 3b, 3c of the same characteristics whose cathodes are connected to each other. The anode of one tuning varactor diode 3b is connected to the other end of the coil 3a. This connection point is connected to the connection point of the two low-band coils 2c, 2d in the VHF input tuning circuit 2. The anode of the other tuning varactor diode 3c is connected to the connection point of the coil 3a and the DC cut capacitor 3f by a DC cut capacitor 3d and a resistor 3e. Accordingly, a bias voltage is applied to the anodes of the two tuning varactor diodes 3b, 3c also by the VHF input tuning circuit 2.

The cathodes of the two tuning varactor diodes 3b, 3c are connected to the tuning voltage terminal Tu and to a UHF high-frequency amplifier 12 by a DC cut capacitor 11. An FET is used also in the UHF high-frequency amplifier 12.

In a stage subsequent to the UHF high-frequency amplifier 12 is provided a UHF inter-stage tuning circuit 13, subsequently to which is provided a UHF mixer (not shown). The UHF inter-stage tuning circuit 13 and the subsequent configuration will not be described.

In the aforementioned configuration, in order to receive a television signal in the VHF band, the VHF high-frequency amplifier 4 is placed in the active state while the UHF high-frequency amplifier 12 is placed in the inactive state. In order to receive a television signal in the UHF band, the UHF high-frequency amplifier 12 is placed in the active state while the VHF high-frequency amplifier 4 is placed in the inactive state.

Figure 2:
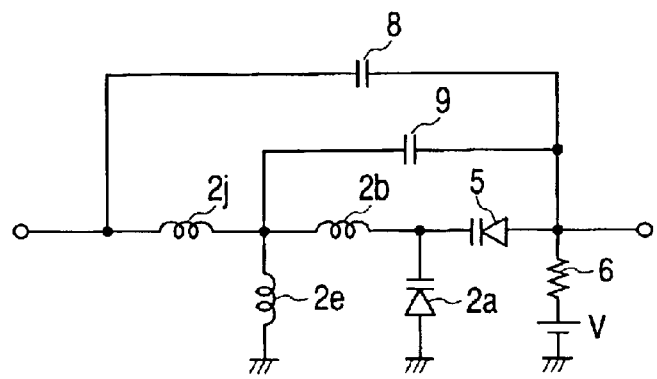
FIG. 2 is an equivalent circuit diagram showing the configuration of a VHF input tuning circuit receiving high-band signals in a television tuner according to the first embodiment of the invention.

In the case of receiving a high-band television signal in the VHF band, a voltage at the band switching terminal Sw is driven low. This turns on the switch diode 2f and the VHF input tuning circuit 2 serves as an equivalent circuit shown in FIG. 2. A coil 2j in FIG. 2 shows two low-band coils 2c, 2d in FIG. 1 connected in parallel. The anode of the tuning varactor diode 2a is grounded and at 0 volts while a bias voltage V divided by the resistors 2h and 2i is applied to the anode of the coupling varactor diode 5.

A tuning frequency is mainly determined by two high-band coils 2b, 2e and a tuning varactor diode 2a. A tuning frequency varies in the high band in accordance with a tuning voltage within the range of about 2.5 to 25 volts applied to the cathode of the tuning varactor diode 2a. The capacitance value of the tuning varactor diode 2a obtained when the tuning voltage is 2.5 volts is about 14.5 pF (picofarad) which is tuned to the lowest frequency of the high band.

A bias voltage V of about two volts is applied to the anode of the coupling varactor diode 5, so that the voltage across the anode and cathode of the coupling varactor diode 5 is about 0.5 volts when the tuning voltage is 2.5 volts, and the corresponding capacitance value is 31.5 pF, exceeding twice the value of 14.5 pF. When the tuning voltage is 25 volts, a capacitance value of 2 to 3 pF is obtained as in the related art. Thus, coupling in higher frequencies is almost constant while coupling in lower frequencies is tighter and coupling of the VHF input tuning circuit 2 and the VHF high-frequency amplifier 4 is much tighter in lower frequencies.

As understood from FIG. 2, a series/parallel-resonance circuit comprises a capacitor 8, a coil 2j, a high-band coil 2b, and a coupling varactor diode 5. Same as the related art configuration, the series/parallel-resonance circuit serves as a trap circuit for attenuating image frequencies that accompany incoming high-band signals by using its parallel resonance frequency.

Further, another series/parallel-resonance circuit comprises a capacitor 9, a high-band coil 2b, and a coupling varactor diode 5. The series/parallel-resonance circuit serves as a trap circuit for attenuating the higher frequencies in the UHF band by using its parallel resonance frequency.

Figure 3:
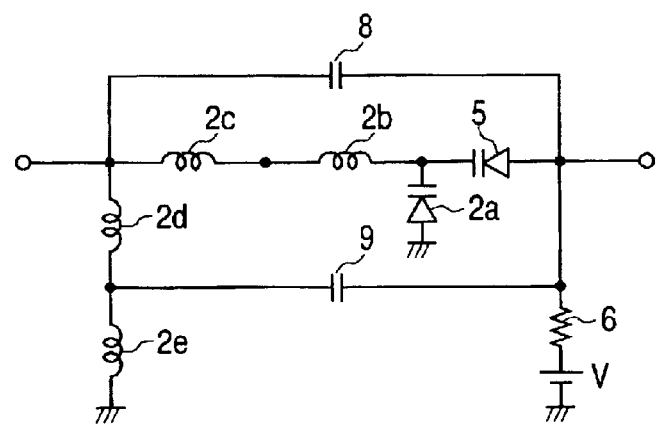
FIG. 3 is an equivalent circuit diagram showing the configuration of a VHF input tuning circuit receiving low-band signals in a television tuner according to the first embodiment of the invention.

In the case of receiving a low-band television signal in the VHF band, a voltage at the band switching terminal Sw is driven high. This turns off the switch diode 2f and the VHF input tuning circuit 2 serves as an equivalent circuit shown in FIG. 3. The capacitor 9 is connected between the connection point of the low-band coil 2d and the high-band coil 2e and the anode of the coupling varactor diode 5. Inductance of the high-band coil 2e is negligible in the low band so that the anode of the coupling varactor diode 5 is shunted by the capacitor 9. This improves the tracking characteristics (variation with the same difference in frequency) of the parallel resonance frequency to attenuate image frequencies and the tuning frequency of the VHF input tuning circuit 2.

A tuning frequency is mainly determined by two high-band coils 2b, 2e, two low-band coils 2c, 2d, and a tuning varactor diode 2a. A tuning frequency varies in the low band in accordance with a tuning voltage within the range of about 2.5 to 25 volts applied to the cathode of the tuning varactor diode 2a. The capacitance value of the tuning varactor diode 2a obtained when the tuning voltage is 2.5 volts is about 14.5 pF (picofarad) which is tuned to the lowest frequency of the low band. Similarly, the capacitance value of the coupling varactor diode 5 is 31.5 pF which provides tighter coupling in lower frequencies.

Figure 4:
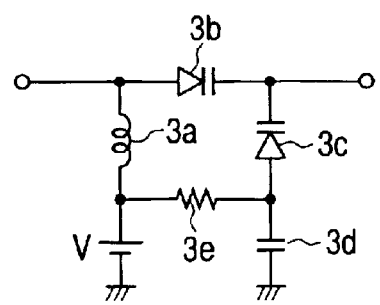
FIG. 4 is an equivalent circuit diagram showing the configuration of a UHF input tuning circuit in a television tuner according to the first embodiment of the invention.

In the UHF input tuning circuit 3, same as the equivalent circuit shown in FIG. 4, a bias voltage V is applied to the anodes of the two tuning varactor diodes 3b, 3c also. The capacitance value obtained when the tuning voltage is 2.5 volts is 31.5 pF thus enhancing the range of tuning frequency.

Figure 5:
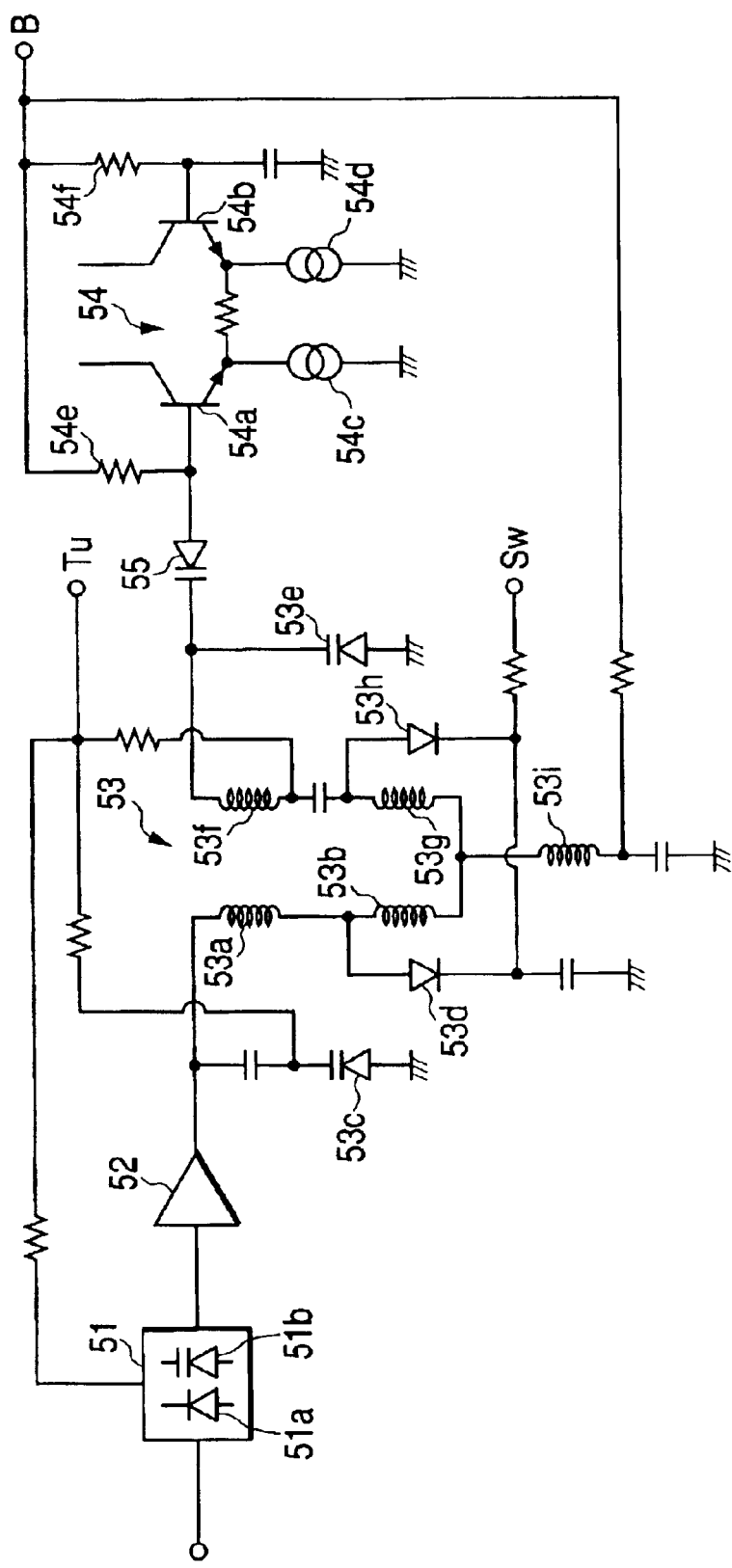
FIG. 5 is a circuit diagram showing the configuration of a television tuner according to the second embodiment of the invention.

FIG. 5 shows the second embodiment of the invention. In FIG. 5, an input tuning circuit 51 to which a television signal in the VHF band is input comprises a single tuning circuit, in which a switch diode 51a and a varactor diode 51b are provided. The switch diode 51a is switched on/off and accordingly the input tuning circuit 51 is switched so as to be tuned to the high band or low band of the VHF band. The anode of the varactor diode 51b is grounded. A tuning voltage is applied to the cathode of the varactor diode 51b by the tuning voltage terminal Tu. By varying the tuning voltage, the tuning frequency varies in each band.

A television signal selected by the input tuning circuit 51 is input to the high-frequency amplifier 52 provided in the subsequent stage and amplified therein. An FET (not shown) is used as an amplifying element used in the high-frequency amplifier 52.

In a stage subsequent to the high-frequency amplifier 52 is provided a double tuning circuit 53. On the preliminary side of the double tuning circuit 53 are provided a high-band coil 53a one end of which is connected to the output end of the high-frequency amplifier 52, a low-band coil 53b serially connected to the other end of the high-band coil 53a, a tuning varactor diode 53c whose anode is grounded and whose cathode is coupled to the output end of the high-frequency amplifier 52, and a switch diode 53d whose anode is connected to the connection point of the high-band coil 53a and the low-band coil 53b and whose cathode is grounded via high frequencies.

On the secondary side of the double tuning circuit 53 are provided a tuning varactor diode 53e whose anode is grounded, a high-band coil 53f one end of which is connected to the cathode of the tuning varactor diode 53e, a low-band coil 53g serially connected to the other end of the high-band coil 53f, and a switch diode 53h whose anode is connected between the high-band coil 53f and the low-band coil 53g and whose cathode is grounded via high frequencies.

Two low-band coils 53b, 53g are connected to each other. To the connection point is connected one end of a coupling coil 53i for coupling the preliminary side and the secondary side. The other end of the coupling coil 53i is grounded via high frequencies. The cathodes of the two tuning varactor diodes 53c, 53e are connected to the tuning voltage terminal Tu. The other end of the coupling coil 53i is also connected to the power terminal B. The cathodes of the two switch diodes 53d, 53h are connected to the band switching terminal Sw. To the power terminal B is applied a power voltage to be supplied to a high frequency amplifier 52. To the band switching terminal Sw is applied a voltage same as the power voltage or 0 volts are applied.

In the double tuning circuit 53, when 0 volts are applied to the band switching terminal Sw, the switch diodes 53d, 53h are turned on to be tuned to the high band. When a voltage same as the power voltage is applied, the switch diodes 53d, 53h are turned off to be tuned to the low band. By varying the tuning voltage, the tuning frequency varies in each band. A television signal selected by the double tuning circuit 53 is input to the mixer 54 for frequency conversion provided in the subsequent stage.

The double tuning circuit 53 and the mixer 54 are coupled by a coupling varactor diode 55. The mixer 54 comprises a known transistor-based double balanced mixer. The anode of the coupling varactor diode 55 is connected to the base of one transistor 54a of the two transistors 54a, 54b on the constant current source in the mixer 54. The cathode of coupling varactor diode 55 is connected to the cathode of the tuning varactor diode 53e on the secondary side. The base of the other transistor 54b is grounded via high frequencies. The emitters of the two transistors 54a, 54b are respectively connected to the constant current sources 54c, 54d. The bases of the two transistors 54a, 54b are connected to the power terminal B via resistors 54e, 54f. As a result, a bias voltage of about 2 volts is applied to each base.

While not shown, two transistors are respectively connected to the collectors of the two transistors 54a, 54b. Between their bases is input a local oscillating signal in a balanced way. An intermediate frequency signal is output from the mixer 54.

In the aforementioned configuration, the tuning varactor diode 51b in the input tuning circuit 51, two tuning varactor diodes 53c, 53e in the double tuning circuit 53, and the coupling varactor diode 55 have the same characteristics. The voltage/capacitance characteristics are such that the inclination of a variation in the capacitance value is steep in a range where the tuning voltage applied to a cathode is lower than that applied to an anode while the inclination of a variation in the capacitance value is gentle in a range where the tuning voltage applied to a cathode is higher to some extent, as shown in FIG. 6.

The variable range of the tuning voltage applied to the cathode of each of the tuning varactor diodes 51b, 53c, 53e and the coupling varactor diode 55 is determined by the range of a tuning frequency required for each tuning circuit 51, 53, and is about 2.5 volts to 25 volts for the high band and about 2.5 volts to 21 volts for the low band. The capacitance value of the tuning varactor diode 51b in the input tuning circuit 51 and the tuning varactor diodes 53c, 53e in the double tuning circuit 53 obtained when the tuning voltage is 2.5 volts is 14.5 pF (picofarad) as shown in FIG. 6. This capacitance value is tuned to the lowest frequency in each band.

Figure 6:
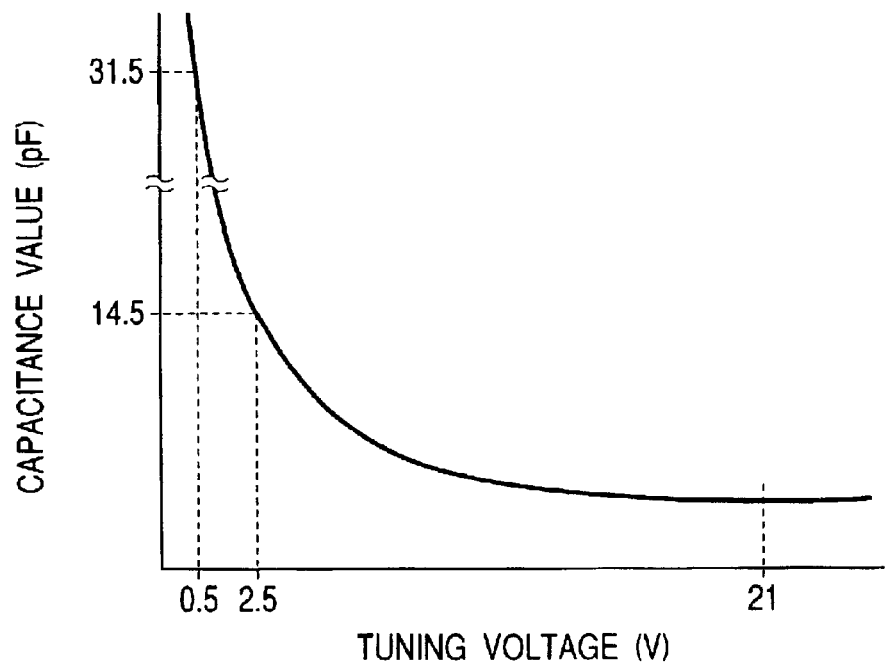
FIG. 6 is a graph showing a relationship between the tuning voltage and the capacitance value of a varactor diode used in the second embodiment of the invention.

A base bias voltage (about two volts) of the transistor 54a in the mixer 54 is applied to the anode of the coupling varactor diode 55, so that the voltage across the anode and cathode of the coupling varactor diode 55 is about 0.5 volts, and the corresponding capacitance value is about 31.5 pF, exceeding twice the value of 14.5 pF, as shown in FIG. 6. Thus, coupling of the double tuning circuit 53 and the mixer 54 becomes tighter at frequencies where the tuning voltage is close to 2.5 volts and the level of a television signal input to the mixer 54 is larger. When the tuning voltage is higher, the capacitance value of the coupling varactor diode 55 is nearly the same as that in the related art so that the coupling amount stays unchanged.

Figure 7:
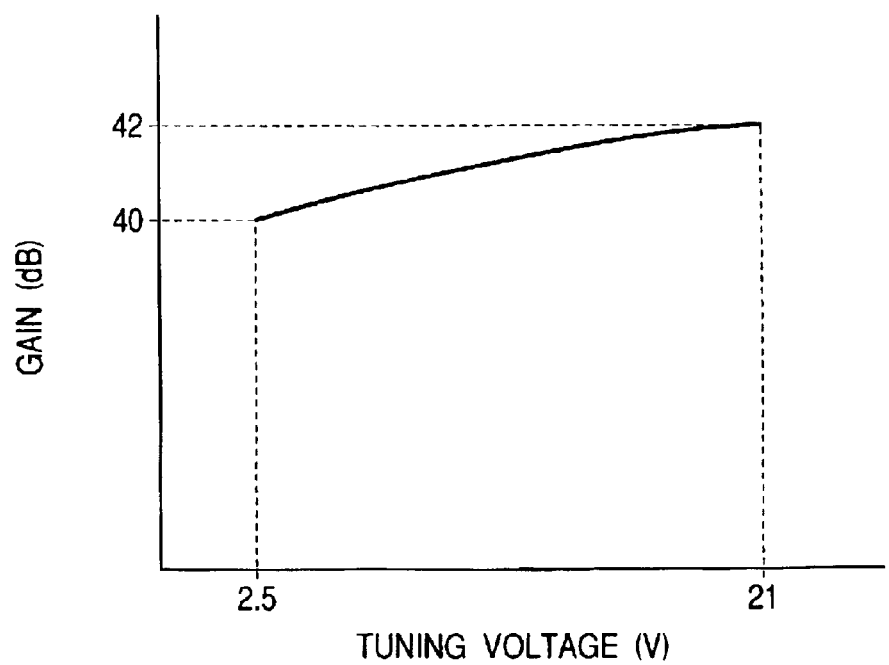
FIG. 7 is a graph showing a relationship between the tuning voltage and the gain of a television tuner according to the second embodiment of the invention.
Figure 8:
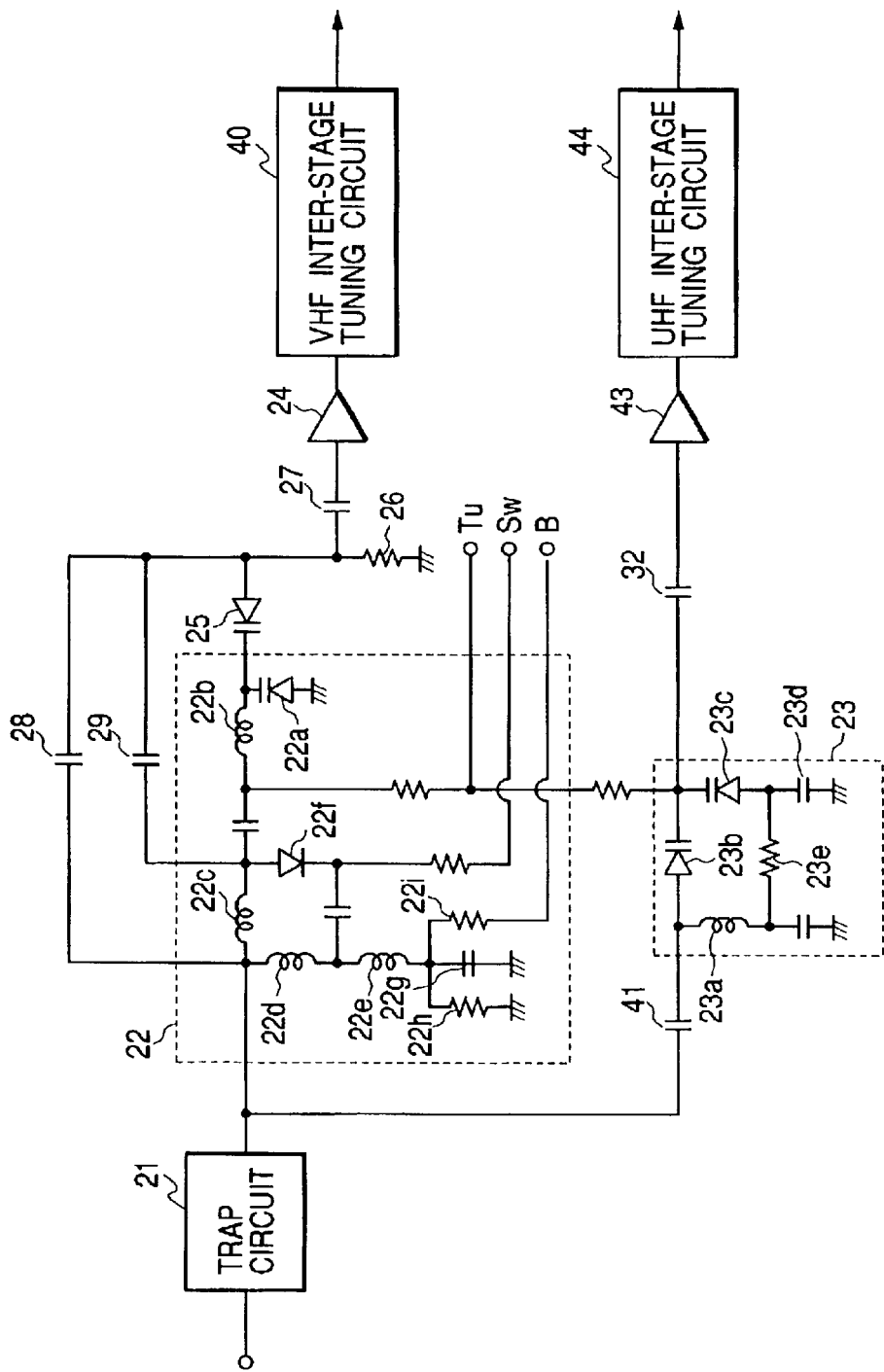
FIG. 8 is a circuit diagram showing the configuration of a related art television tuner.
Figure 9:
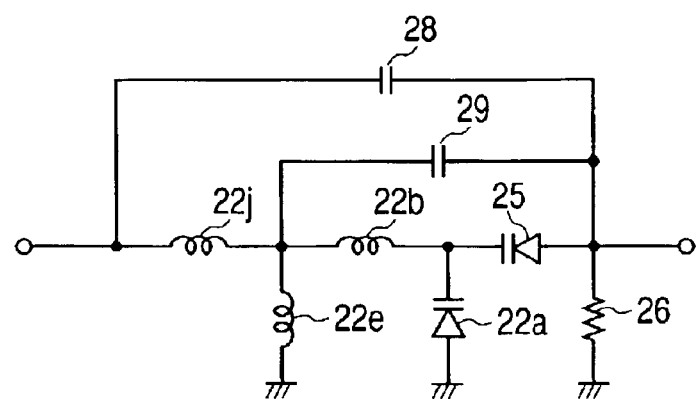
FIG. 9 is an equivalent circuit diagram showing the configuration of a VHF input tuning circuit receiving high-band signals in a related art television tuner.
Figure 10:
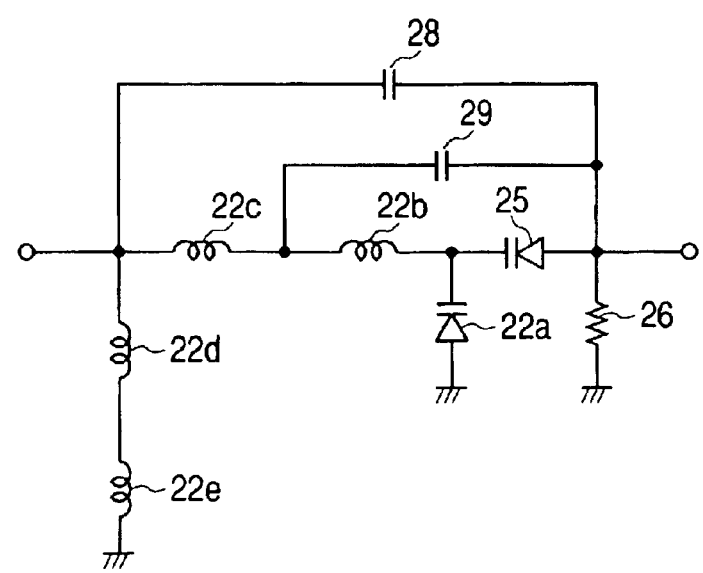
FIG. 10 is an equivalent circuit diagram showing the configuration of a VHF input tuning circuit receiving low-band signals in a related art television tuner.

A gain rises at frequencies where the tuning voltage is lower while a gain stays almost constant at frequencies where the tuning voltage is higher. For example, as shown in FIG. 7, the overall gain in the low band is 40 dB in the lowest-frequency channel where the tuning voltage is 2.5 volts and 42 dB, the same as in the related art, when the tuning voltage is 21 volts. Thus a gain deviation in the low band is 2 dB, showing an improvement of 2 dB compared with the related art. NF is 5.8 dB in the lowest-frequency channel and 4.4 dB when the tuning voltage is 21 volts, showing an improvement in the low band.

Such an effect is obtained in the high band also.

While a bias voltage of two volts is applied to the anode of the coupling varactor diode 55 by directly connecting the anode of the coupling varactor diode 55 to the base of the transistor 54a in the mixer 54, the invention is not limited to this configuration but a bias voltage may be applied using a resistance type potential divider circuit. In any way, it is required that the bias voltage applied to the anode of the coupling varactor be higher than the voltage at the anode of the tuning varactor diode and lower than the minimum value of tuning voltage.

Figure 11:
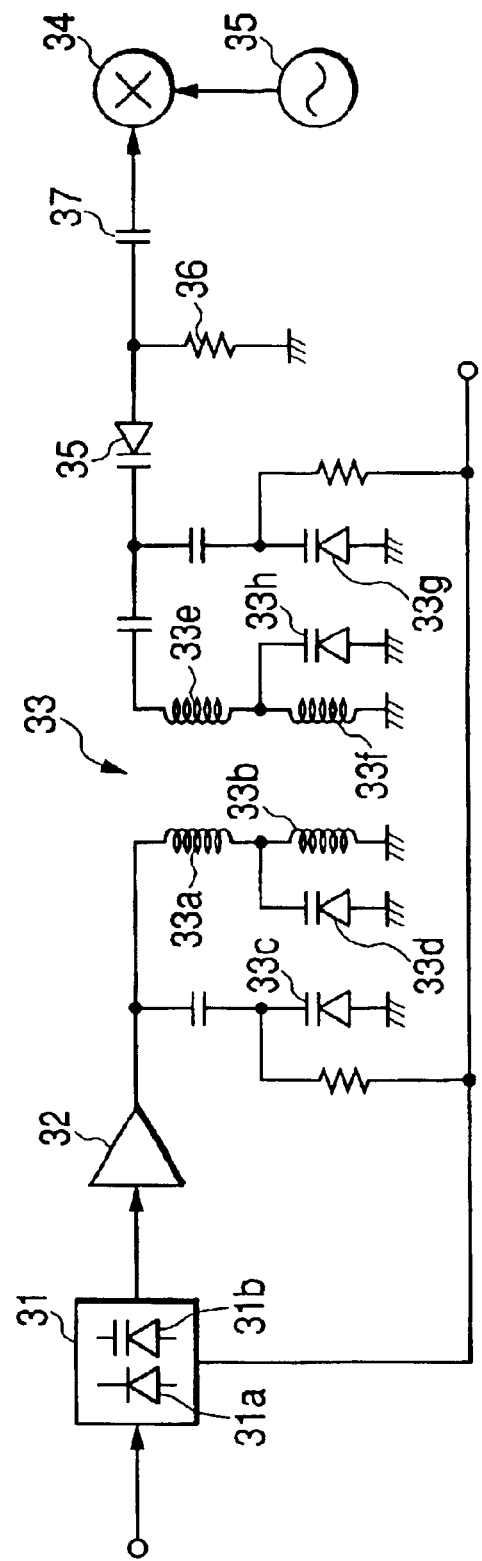
FIG. 11 is a circuit diagram showing the configuration of a related art television tuner.
Figure 12:
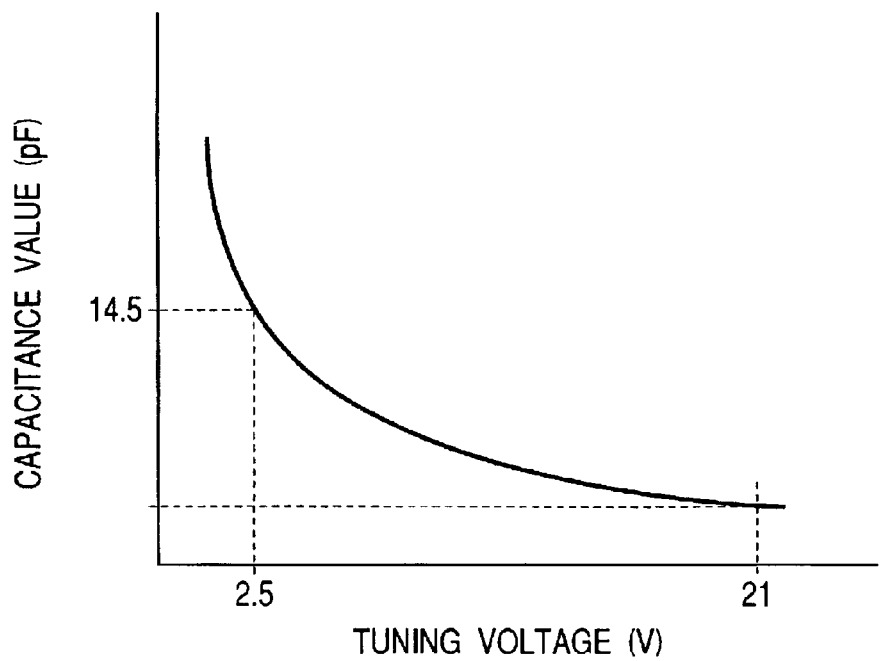
FIG. 12 is a graph showing a relationship between the tuning voltage and the capacitance value of a varactor diode used in a related art example.
Figure 13:
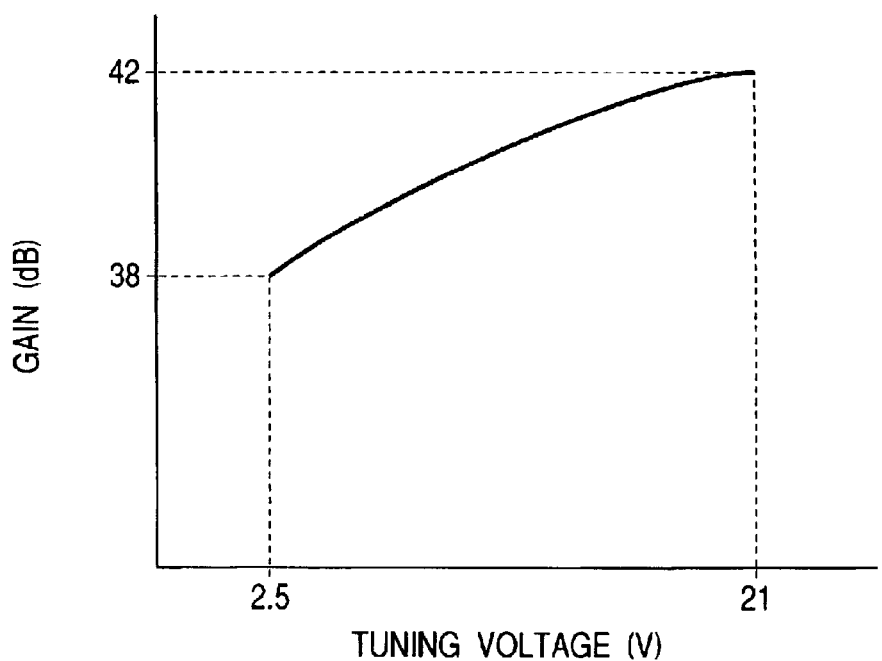
FIG. 13 is a graph showing a relationship between the tuning voltage and the gain of a related art television tuner.

The aforementioned configuration is advantageous in that parts cost may be reduced because a resistor for fixing an anode to a DC-based reference potential point (resistor 36 in FIG. 11) and a DC cut capacitor for coupling to the mixer 54 (DC cut capacitor 37 in FIG. 11) may be omitted by directly connecting the anode of the coupling varactor diode 55 to the base of the transistor 54a in the mixer 54.

As mentioned earlier, a television tuner of the invention comprises an input tuning circuit having a tuning varactor diode whose tuning frequency varies with a tuning voltage applied to the cathode of the tuning varactor diode, a high-frequency amplifier provided in a stage subsequent to the input tuning circuit, and a coupling varactor diode for coupling the input tuning circuit to the high-frequency amplifier, in which the cathode of the coupling varactor diode and that of the tuning varactor diode are connected with each other and a bias voltage higher than the voltage at the anode of the tuning varactor diode and lower than the lowest voltage of the tuning voltage is applied to the anode of the coupling varactor diode. As a result, the capacitance value of, a coupling varactor diode at a low tuning voltage is increased while it stays almost constant at a high tuning voltage. Thus, coupling of an input tuning circuit and a high-frequency amplifier is tighter in a low-frequency channel. This increases a gain and allows a gain in a band to be leveled.

In a television tuner of the invention the input tuning circuit has a switch diode switched on/off and comprises a band-switching tuning circuit tuned to the high-band or low band of the VHF band corresponding to switching on/off, a fixed bias voltage is applied to the anode of the switch diode and a switching voltage to turn on/off the circuit is applied to the cathode thereof, and the anode of the tuning varactor diode is grounded and the anode of the coupling varactor diode is connected to the anode of the switch diode via a DC. This makes it easy to apply a bias voltage to the anode of a coupling varactor diode.

A television tuner of the invention comprises a double tuning circuit having a tuning varactor diode whose tuning frequency varies with a tuning voltage applied to the cathode of the tuning varactor diode, a mixer provided in a stage subsequent to the double tuning circuit, and a coupling varactor diode for coupling the double tuning circuit to the mixer, in which the cathode of the coupling varactor diode and that of the tuning varactor diode are connected with each other and a bias voltage higher than the voltage at the anode of the tuning varactor diode and lower than the lowest voltage of the tuning voltage is applied to the anode of the coupling varactor diode. Thus, coupling of a double tuning circuit and a mixer is tighter in a band where the tuning voltage is low while the coupling amount stays unchanged in a band where the tuning voltage is high. This increases a gain in a band where the tuning voltage is low and allows a gain deviation in the same band to be leveled.

In a television tuner of the invention the mixer has a transistor to whose base is applied a bias voltage and the anode of the tuning varactor diode is grounded and the anode of the coupling varactor diode is directly connected to the base of the transistor. As a result, a resistor for fixing the anode of a coupling varactor diode to a DC-based reference potential point and a DC cut capacitor for coupling to a mixer may be omitted, thus reducing the parts cost.

In a television tuner of the invention the double tuning circuit comprises a band-switching tuning circuit tuned to the high-band or low band television signals in the VHF band. This allows a gain deviation to be leveled in both the high and low band.

What is claimed is:

1. A television tuner comprising an input tuning circuit having a tuning varactor diode whose tuning frequency varies with a tuning voltage applied to a cathode of said tuning varactor diode, a high-frequency amplifier provided in a stage subsequent to said input tuning circuit, and a coupling varactor diode for coupling said input tuning circuit to said high-frequency amplifier, wherein a cathode of said coupling varactor diode and that of said tuning varactor diode are connected with each other and a bias voltage higher than a voltage at an anode of said tuning varactor diode and lower than a lowest voltage of said tuning voltage is applied to an anode of said coupling varactor diode.

2. A television tuner according to claim 1, wherein said input tuning circuit has a switch diode switched on/off and comprises a band-switching tuning circuit tuned to one of a high-band and low band at a VHF band corresponding to switching on/off, a fixed bias voltage is applied to an anode of said switch diode and a switching voltage to turn on/off the band-switching circuit is applied to a cathode thereof and the anode of said tuning varactor diode is grounded and the anode of said coupling varactor diode is connected to the anode of said switch diode at DC via a resistor.

3. A television tuner comprising a double tuning circuit having a tuning varactor diode whose tuning frequency varies with a tuning voltage applied to a cathode of said tuning varactor diodes, mixer provided in a stage subsequent to said double tuning circuit, and a coupling varactor diode for coupling said double tuning circuit to said mixer, wherein a cathode of said coupling varactor diode and that of said tuning varactor diode are connected with each other and a bias voltage higher than a voltage at an anode of said tuning varactor diode and lower than a lowest voltage of said tuning voltage is applied to an anode of said coupling varactor diode.

4. A television tuner according to claim 3, wherein said mixer has a transistor to whose base is applied a bias voltage and the anode of said tuning varactor diode is grounded and the anode of said coupling varactor diode is directly connected to the base of said transistor.

5. A television tuner according to claim 3, wherein said double tuning circuit comprises a band-switching tuning circuit tuned to one of high-band and low band television signals in a VHF band.

* * * * *